United States Patent [19]

Kirton

[11] Patent Number: 5,235,217
[45] Date of Patent: Aug. 10, 1993

[54] CAPACITIVE PRESS CONTROL ACTUATION SYSTEM

[75] Inventor: James Kirton, Naugatuck, Conn.
[73] Assignee: ISB Ltd., Dorval, Canada
[21] Appl. No.: 735,084
[22] Filed: Jul. 24, 1991
[51] Int. Cl.$^5$ .................. H01H 9/26; H01H 9/00; F16P 3/20; H03K 17/96
[52] U.S. Cl. .................. 307/326; 307/328; 307/116; 307/141.4; 361/181; 361/189; 200/600; 192/131 R; 192/129 A; 340/562; 340/573; 328/5; 328/7
[58] Field of Search ............ 307/308, 326, 328, 112, 307/116, 140, 141.4; 361/179, 181, 280, 189; 200/600, 61.85; 328/5, 7; 192/129 R-132, 129 A; 340/551, 552, 561, 562, 573

[56] References Cited

U.S. PATENT DOCUMENTS

| | | | |
|---|---|---|---|
| 3,895,269 | 7/1975 | Geremia | 307/113 X |
| 4,053,789 | 10/1977 | Schultz | 307/116 |
| 4,054,935 | 10/1977 | Ginsberg | 361/189 |
| 4,090,091 | 5/1978 | Brown et al. | 307/116 |
| 4,225,748 | 9/1980 | Buck et al. | 361/179 X |
| 4,246,533 | 1/1981 | Chiang | 307/116 |
| 4,290,052 | 9/1981 | Eichelberger et al. | 341/33 |
| 4,325,058 | 4/1982 | Wagner et al. | 340/562 |
| 4,412,268 | 10/1983 | Dassow | 361/189 X |
| 4,760,326 | 7/1988 | Bird | 361/179 X |
| 4,894,493 | 1/1990 | Smith et al. | 200/600 X |
| 5,168,173 | 12/1992 | Windsor | 307/139 |

FOREIGN PATENT DOCUMENTS

| | | | |
|---|---|---|---|
| 2716685 | 1/1979 | Fed. Rep. of Germany | 192/131 R |
| 3414480 | 10/1985 | Fed. Rep. of Germany | 361/179 |
| 3438422 | 4/1986 | Fed. Rep. of Germany | 361/179 |
| 2117117A | 10/1983 | United Kingdom | 200/600 |

OTHER PUBLICATIONS

Hoberman, Stu; "Touch Module-This New Version Does Many Jobs"; Popular Science, Feb. 1973, pp. 124–125.

Primary Examiner—A. D. Pellinen
Assistant Examiner—Fritz M. Fleming
Attorney, Agent, or Firm—John H. Crozier

[57] ABSTRACT

In a preferred embodiment, a capacitive switch system including two capacitive switches which must be activated nearly simultaneously to operate a piece of equipment. When one switch is touched, a timing function is activated. If a predetermined length of time lapses before the other switch is touched, the other switch will be locked out. Both switches must then be released before the activation procedure is re-initiated. The components providing timed and anti-tie-down features, are integral to the circuitry of the switches and these as well as output relays are compactly housed in the switch housings to prevent tampering and circumvention of the safety features. The sensitivity of the switches is such that they cannot be activated by liquids.

20 Claims, 8 Drawing Sheets

CAPACITIVE PRESS CONTROL ACTUATION SYSTEM

BACKGROUND OF THE INVENTION

1. Field of the Invention

The present invention relates to press controls generally and, more specifically, to a novel press control activation system for hand fed power presses and like machines that is self-contained, includes an anti-tie-down feature that cannot be defeated, and eliminates the possibility of an operator developing carpel tunnel syndrome from repeatedly pressing buttons.

2. Background Art

Hand fed power presses and like machines are widely used in the manufacturing industries in a variety of punching, stamping, shearing, and similar operations. Typically in such an operation, the operator places a piece of sheet metal or similar piece of stock to be punched, stamped, sheared, or the like in position in the machinery. Since the operation is extremely hazardous, it is necessary to ensure that the both of the operator's hands are clear of the operating area before the machinery is operated, or "tripped," to initiate the operating cycle. Conventionally, such has been ensured by requiring the operator to simultaneously or nearly simultaneously depress two spaced apart switches, one with each hand, in order to trip the machinery. After the sheet metal or stock is operated on, the machinery returns to its non-operating position and the operator is free to use his hands to remove the part.

A disadvantage of some conventional tripping systems is that one switch could be "tied-down" by placing an object against it, for example, and thus the operator would have one hand free to perhaps increase the overall speed of the operation and, therefore, his productivity. To combat this procedure, anti-tie-down controls have been incorporated into the machinery controls so that the switches have to be depressed simultaneously or nearly simultaneously and that depression of the switches has to be maintained throughout the operation. A disadvantage of this type of system, however, is that, since the timed and anti-tie-down circuitry is separate from the switches and is readily accessible, the circuitry can be defeated easily by the operator or other persons - or simply omitted from the installation. Likewise, since the heavy duty relays that provide power to the machinery are also provided as separate components, further opportunity to defeat safety features is available.

A further disadvantage of some conventional tripping systems is that, although the force required to operate a spring-loaded switch is perhaps only a few ounces, the repetition of the pressing motion by the operator over a period of time tends to lead to the development of painful tunnel carpel syndrome in the hands of the user. Besides being painful to the operator, such job-related illnesses are costly to the manufacturers and to the insurance carriers. This problem has been overcome in some tripping systems through the use of capacitive proximity switches which do not require exerting pressure to activate them. Unfortunately, such capacitive proximity switches heretofore employed have been extremely sensitive, being activatable by liquids such as by merely spraying glass cleaner on them. Obviously, such sensitivity presents a serious safety hazard.

Accordingly, it is a principal object of the present invention to provide a press control system in which power relays and anti-tie-down circuitry are an integral part thereof and cannot be defeated.

It is a further object of the invention to provide such a press control system which does not require the pressing of buttons to operate, yet cannot be operated by the presence of oil, water, or other liquids that may be present in the manufacturing area.

It is another object of the invention to provide such a press control system which can be easily retrofitted to existing machinery.

Other objects of the present invention, as well as particular features, elements, and advantages thereof, will be elucidated in, or be apparent from, the following description and the accompanying drawing figures.

SUMMARY OF THE INVENTION

The present invention achieves the above objects, among others, by providing, in a preferred embodiment, a capacitive switch system including two capacitive switches which must be activated nearly simultaneously to operate a piece of equipment. When one switch is touched, a timing function is activated. If a predetermined length of time lapses before the other switch is touched, the other switch will be locked out. Both switches must then be released before the activation procedure is re-initiated. The components providing timed and anti-tie-down features, are integral to the circuitry of the switches and these as well as output relays are compactly housed in the switch housings to prevent tampering and circumvention of the safety features. The sensitivity of the switches is such that they cannot be activated by liquids.

BRIEF DESCRIPTION OF THE DRAWING

Understanding of the present invention and the various aspects thereof will be facilitated by reference to the accompanying drawing figures, submitted for purposes of illustration only and not intended to define the scope of the invention, in which.

DETAILED DESCRIPTION OF THE PREFERRED EMBODIMENTS

Figure 1:
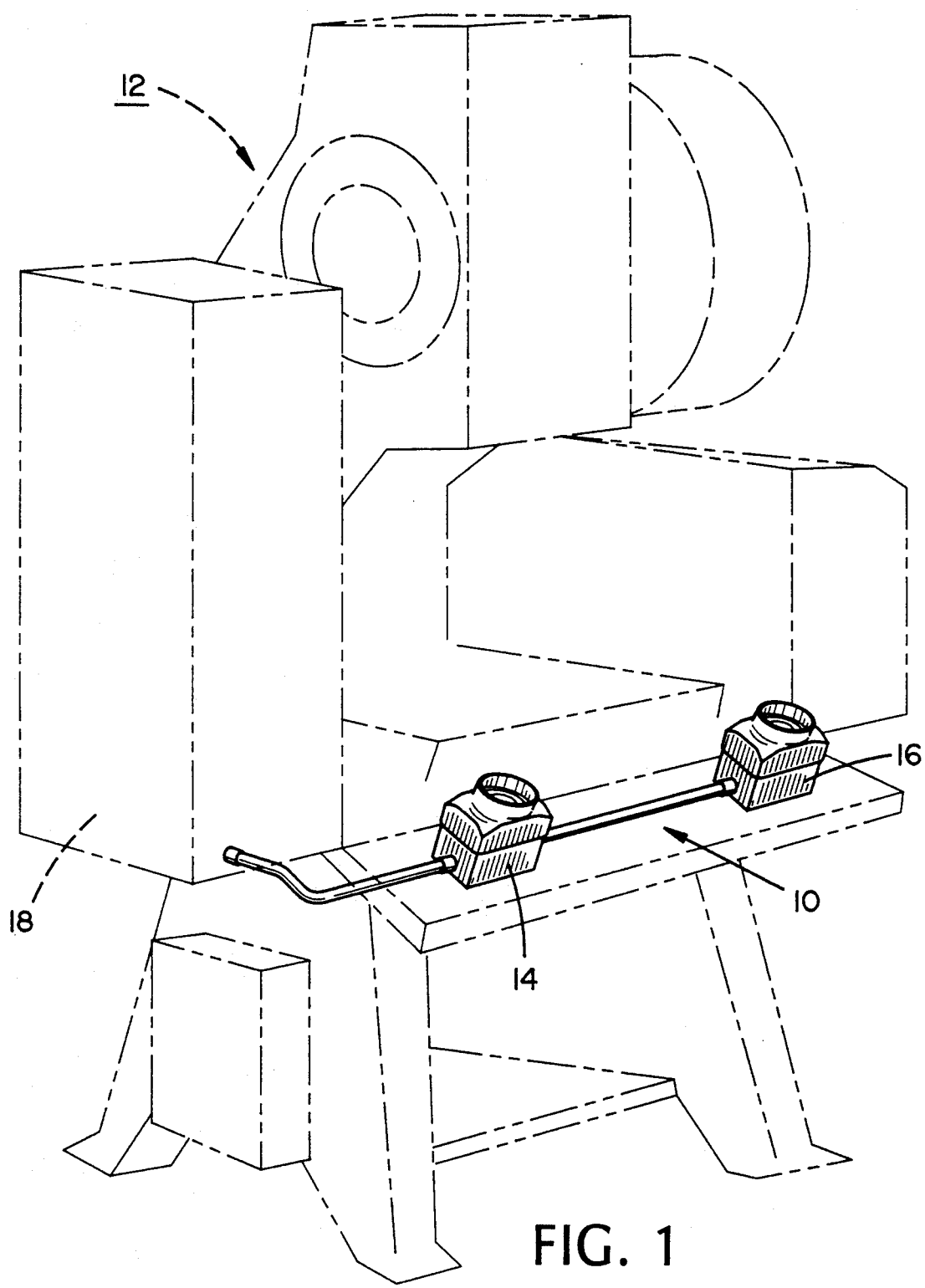
FIG. 1 is a perspective view of a press control activation system installed on a piece of machinery.

Reference should now be made to the drawing figures in which similar or identical elements are given consistent identifying numerals throughout the various figures thereof. Parenthetical references to figure numbers direct the reader to the figures(s) in which the element(s) being described is (are) best seen, although the element(s) may be seen also in other figures.

FIG. 1 depicts a press control activation system (solid lines), generally indicated by the reference numeral 10, mounted on a machine (broken lines), generally indicated by the reference numeral 12, which may be assumed to be a conventional punch, for example. System 10 includes interconnected switches 14 and 16 mounted on machine 12 and connected to a control box 18 in which is disposed electrical circuitry for operating the machine. As will be described in greater detail below, to operate machine 12, a human operator (not shown) would place a finger or fingers of his left and right hands in the upper portions of switches 14 and 16, respectively, within a predetermined time period, thus activating the control circuitry of the machine. If too long a period elapses between activation of first of switches 14 and 16, the second of the switches will be locked out and both hands will have to be removed from the switches and the activation procedure repeated.

Figure 2:
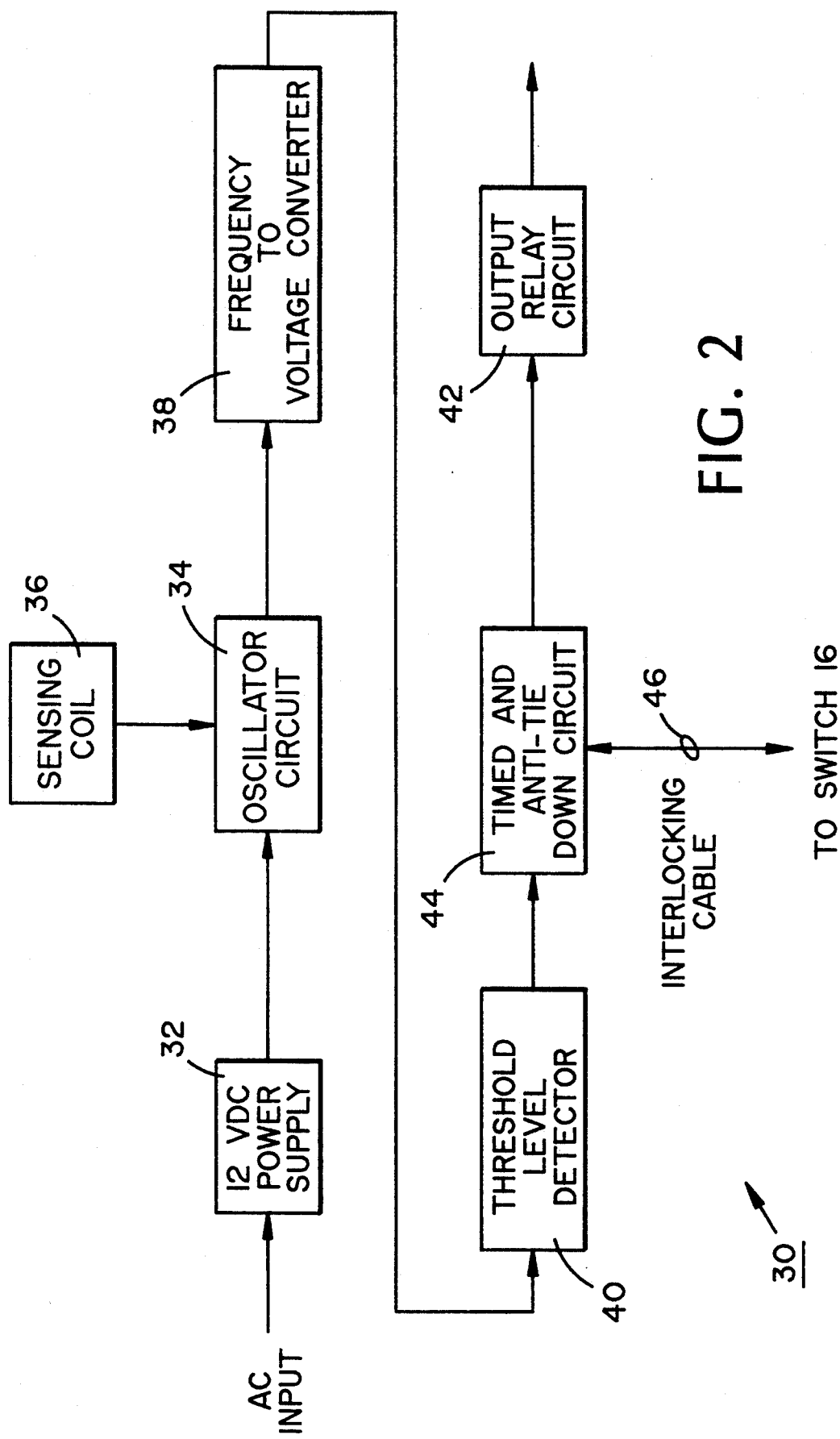
FIG. 2 is a block diagram illustrating the circuitry of one switch of the system of FIG. 1.

Referring now to FIG. 2, there is schematically illustrated electronic/electrical circuitry, generally indicated by the reference numeral 30, which may be assumed to be the circuitry disposed within switch 14. It will be understood that identical circuitry (not shown) is disposed within switch 16 and is interconnected with circuitry 30 as will be described more fully below.

Circuitry 30 includes a power supply 32. Circuitry 30 further includes an oscillator circuit 34 and a sensing coil 36, the oscillator circuit providing an output responsive to the placing of fingers in the top part of switch 14 (FIG. 1) in proximity to the sensing coil. The output of oscillator circuit 34 is an input to a frequency to voltage converter 38 which provides an output voltage proportional to the frequency received from the oscillator circuit. The output voltage from frequency to voltage converter 38 is received by a threshold level detector 40 which, when the output voltage reaches a predetermined level, causes a heavy duty output relay 42 circuit to be activated through a timed anti-tie down circuit 44. Such activation will occur provided that switch 16 (FIG. 1) has not been activated a predetermined length of time before the activation of switch 14, the latter information being transmitted through interconnecting cable 46. If switch 16 has been activated for greater than the predetermined length of time, timed and anti-tie down circuit 44 will prevent the activation of output relay 42.

Figure 3A:
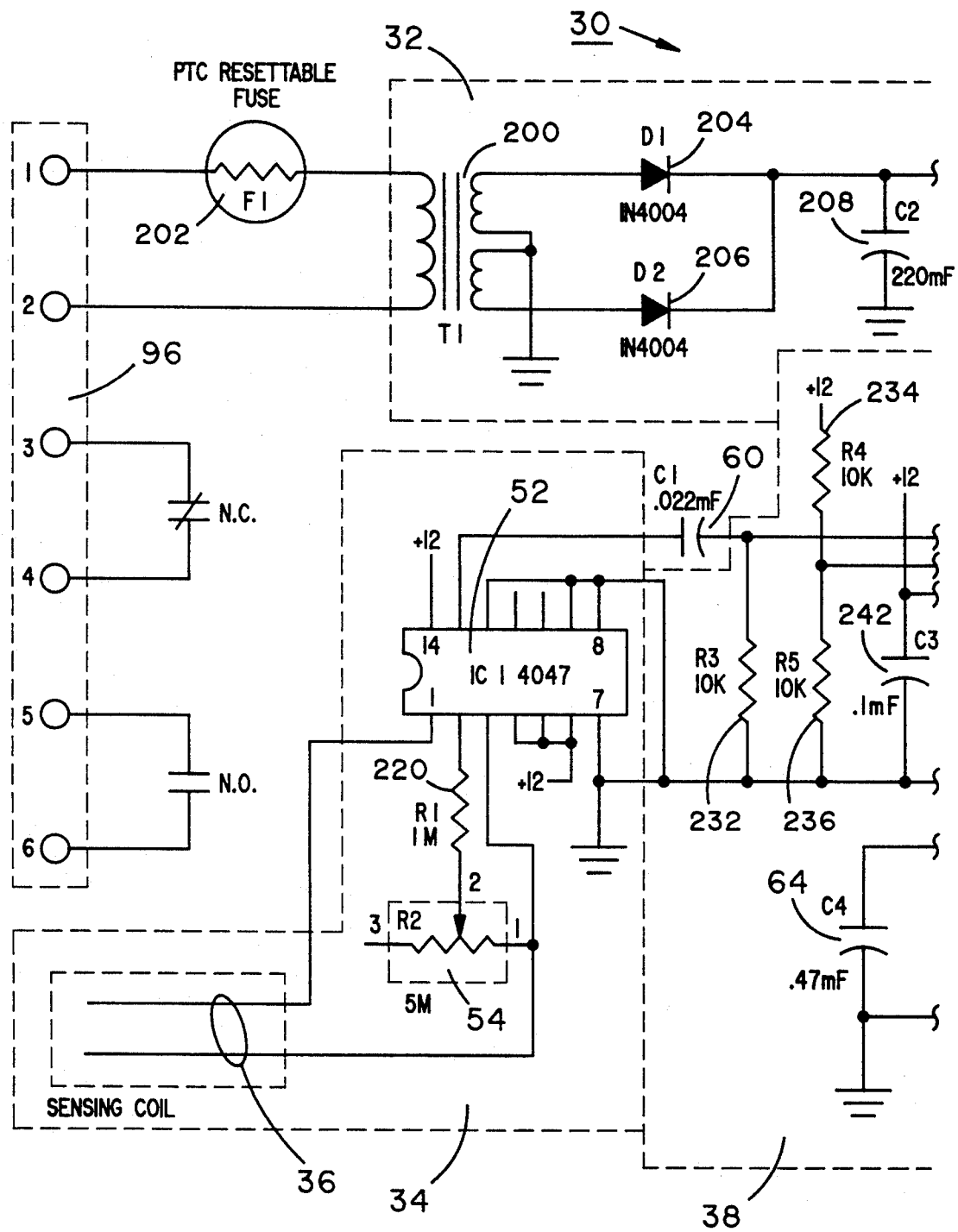
FIGS. 3(a)-(c) together comprise a schematic diagram of the circuitry of FIG. 2.
Figure 3B:
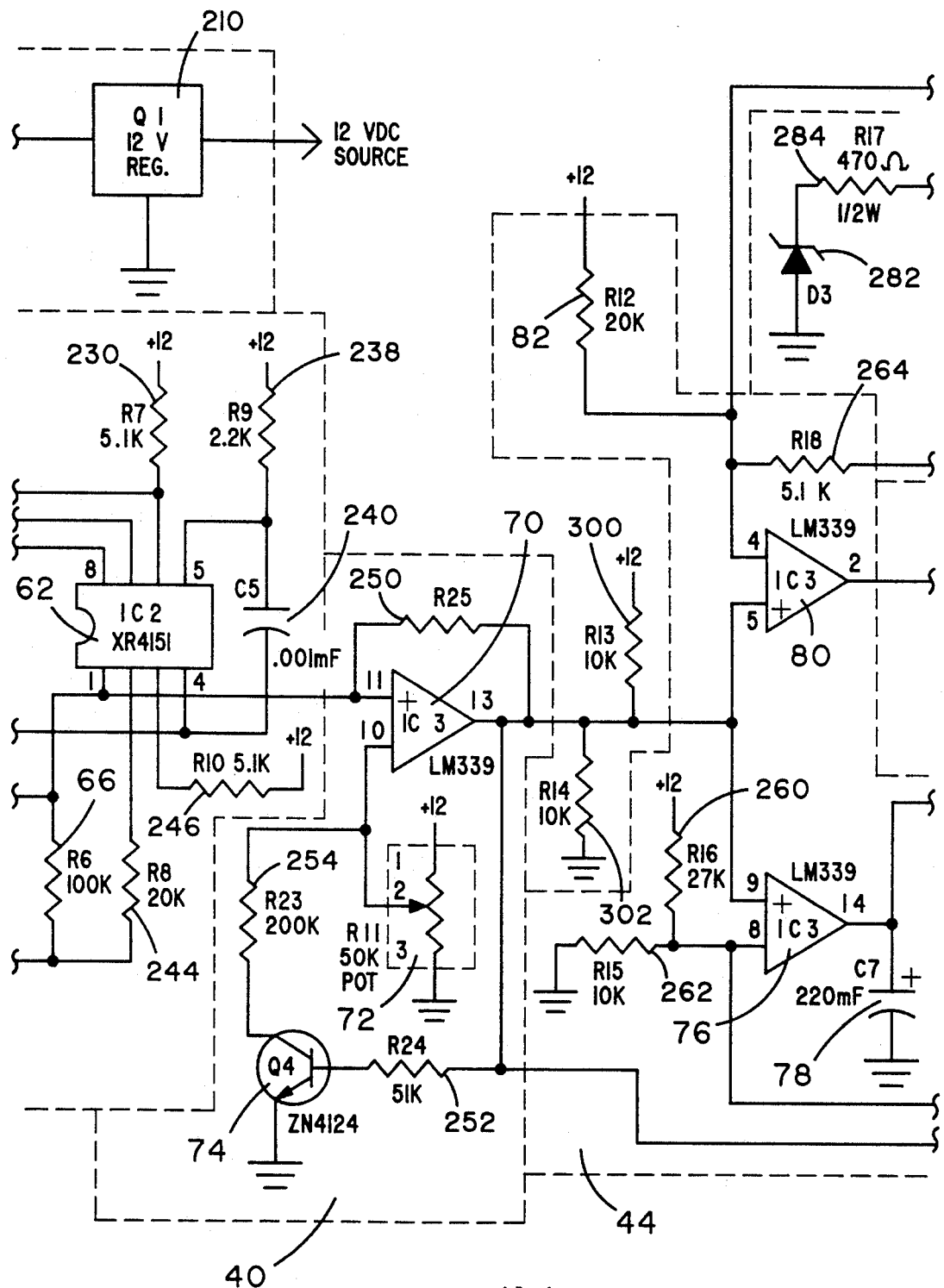
Figure 3C:
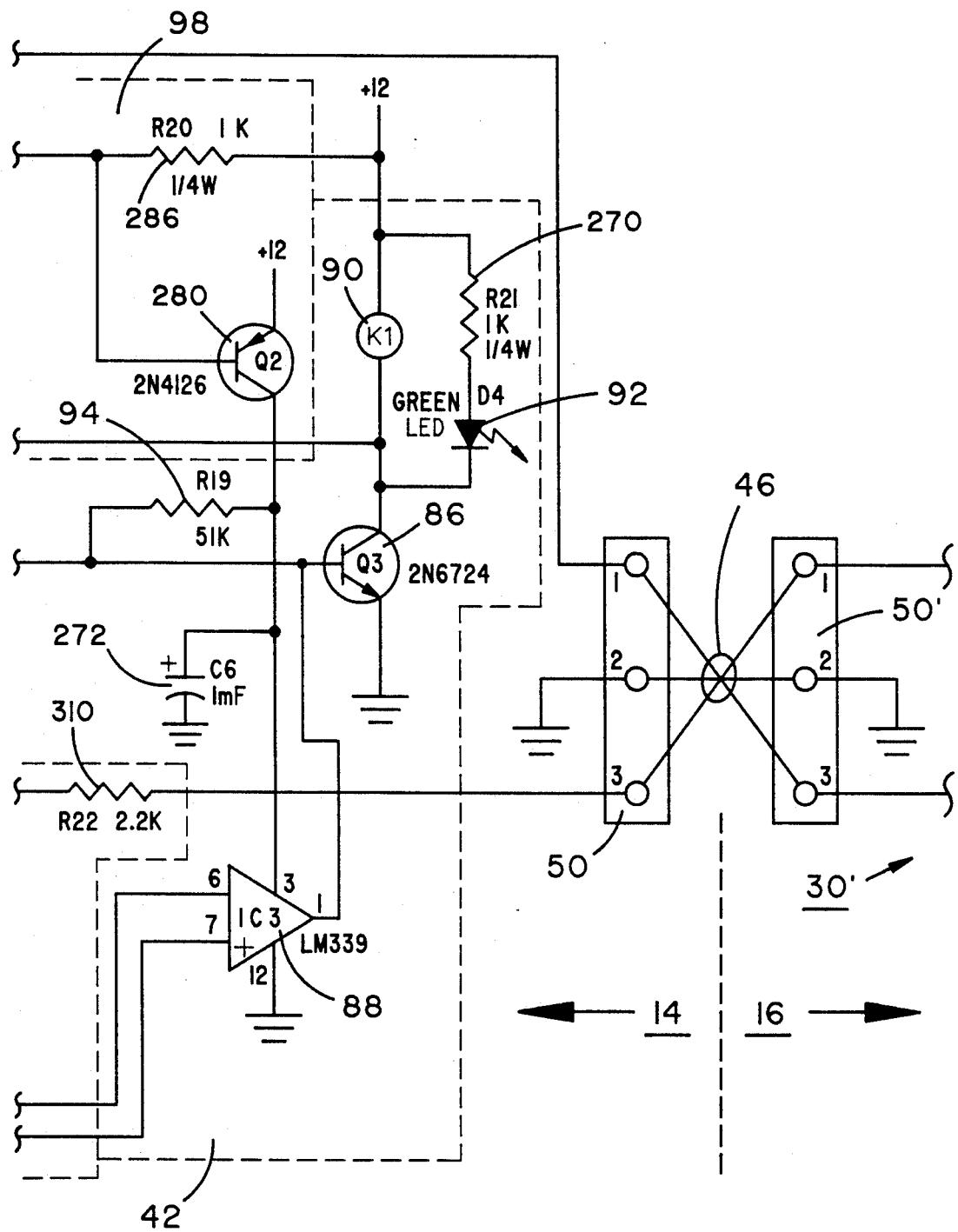
Figure 3D:
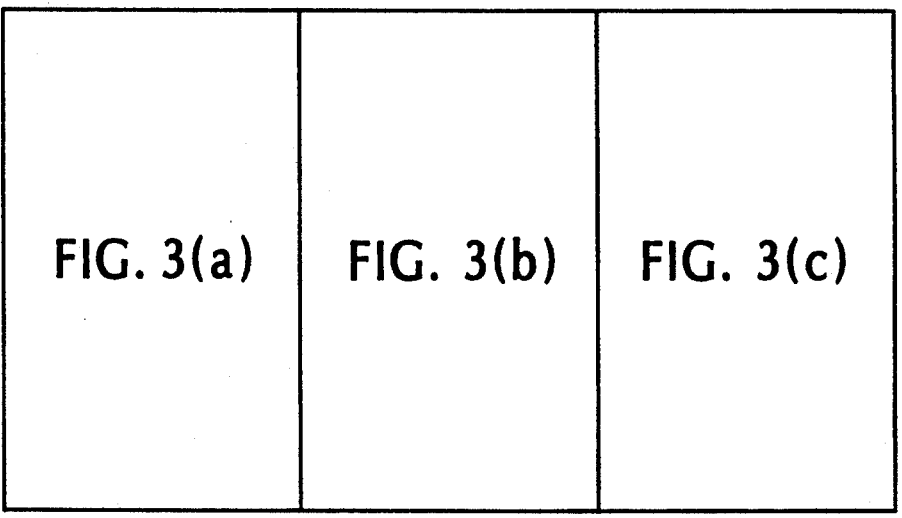
FIG. 3(d) is a diagram showing the arrangement of FIGS. 3(a)-(c) for the reading thereof.

FIGS. 3(a)-(c) illustrate in more detail the components and operation of circuitry 30. It will aid in understanding the operation of circuitry 30 to refer first to the right-hand side of FIG. 3(c) and note that switch 16 includes circuitry 30' (only partially shown) identical to, and a mirror image of, that of circuitry 30 of switch 14 and that the two are interconnected by interlocking cable 46 such that pin 3 of terminal board 50 of switch 14 is connected to pin 1 of terminal board 50' of switch 16 and that pin 1 of terminal board 50 is connected to pin 3 of terminal board 50'. Other components (not shown) of switch 16 will be referred to by primed reference numerals of the corresponding components of circuitry 30.

A transformer 200 in power supply 32 receives input AC power from pins 1 and 2 of a terminal board 96 and is protected by PTC resettable fuse 202. Diodes 204 and 206 convert the output of transformer 200 to DC power which is filtered by a capacitor 208. 12-Volt regulator 210 creates a stable 12-volt DC supply.

Oscillator circuit 34 includes an integrated circuit 52, a capacitive sensing coil 36, and a potentiometer 54. A resistor 220 is part of a R-C circuit which creates frequency of oscillator circuit 34. Resistor 220 with potentiometer 54 establish the frequency. When an object, such as the finger(s) of an operator are in proximity to sensing coil 36, the output frequency increases. This output frequency is coupled to frequency to voltage converter 38 through a capacitor 60.

Frequency to voltage converter 38 includes an integrated converter circuit 62, a capacitor 64, and a resistor 66, the latter two elements being provided at the output of circuit 62 to filter out short duration spikes. Two resistors 230 and 232 create a voltage divider level for the input to frequency to voltage converter 38. Two resistors 234 and 236 create a voltage divider level for frequency to voltage converter 38. A resistor 238 and a capacitor 240 set the timing for the one shot part of frequency to voltage converter 238. A capacitor 242 filters the 12-volt DC supply. A resistor 244 sets the scale factor for the output voltage. Typically, the output range is to about 4 volts. A resistor 246 provides a supply voltage for the open collector logic output of frequency to voltage converter 38 (not used in circuitry 30).

Threshold level detector 40 includes a comparator 70 the reference input voltage to which is set by potentiometer 72. The reference is typically set for about 75 percent of the change of frequency to voltage converter 38. When the output of frequency to voltage converter 38 exceeds the threshold level, the output of pin 13 of comparator 70 goes high. This causes a transistor 74 to conduct, thus lowering the reference voltage to comparator 70 by about 0.8 volts, so as to prevent electronic chattering of its output in the case of a marginal signal. A resistor 250 provides a feedback circuit to comparator 70 to prevent unwanted oscillations. A resistor 252 provides a bias current to transistor 74 to turn on the transistor. When transistor 74 is turned on, a resistor 254 lowers the reference voltage to comparator 70, creating a hysteresis value to prevent unwanted oscillation of the output of the comparator caused by slight movements of the hand on switch 14.

Resistors 300 and 302 comprise a voltage divider limiting the maximum output voltage of comparator 70 to 6 volts.

The output of threshold level detector 40 is coupled to timed and anti-tie down circuit 44 which includes a comparator 76, a capacitor 78, a comparator 80, and a resistor 82. A resistor 310 protects pin 14 of comparator 76 from possible excessive current if interlocking cable 46 were to be shorted out. Resistors 260 and 262 comprise a voltage divider that creates a reference voltage for comparator 76. A resistor 264 provides a signal for circuit 44 that the relay turned on before the time out. When an operator places his fingers in proximity to sensing coil 36, the resulting high signal at pin 13 of comparator 70 provides 6-volt input signals to comparators 76 and 80. If the reference input to comparator 80 is low, the comparator will output a high voltage to output relay 42. The high input to comparator 76, in turn, causes the voltage at pin 14 thereof to start rising via resistor 82' of circuit 30' and, therefore, the reference input to comparator 80' to rise. When this voltage level exceeds approximately 6 volts, switch 16, if not already activated is locked out, since the input signal to comparator 80' therein cannot exceed the reference voltage thereto. The time interval in which switch 16 can be activated after activation of switch 14 is determined by the values of capacitor 78 and resistor 82' and is approximately 300 milliseconds for the values indicated.

Likewise, if switch 16 is activated before switch 14, the reference voltage to comparator 80 will begin to rise by virtue of capacitor 76' and resistor 82 and, if comparator 80 does not receive the 6-volt input before its reference voltage reaches 6 volts, switch 14 will be locked out.

It will thus be understood that when one of switches 14 and 16 is activated, the other of the switches must be activated within a predetermined period of time, elsewise, activation of the other switch is prevented. Furthermore, once a switch is locked out, the other switch must be released before the first switch can be activated. Because of the short time interval involved, 300 milliseconds for the circuit described, this means effectively that both switches must be released before the operating procedure can be repeated. This arrangement defeats any attempt to tie down one of the switches.

Referring still to FIGS. 3(a)-(c), output relay circuit 42 includes a transistor 86, a comparator 88, a relay coil 90, an LED 92, and a resistor 94. A resistor 270 creates the correct bias voltage and current for LED 92. A capacitor 272 filters the supply voltage for comparator 88. Once comparator 80 receives a high input before receiving a 6-volt reference voltage, it will provide a high output to the base of transistor 86, causing the transistor to conduct, thus activating relay 90. Relay 90 is connected (not shown) to the normally open pins, pins 5 and 6, and to the normally closed pins, pins 3 and 4, on terminal board 96. Comparator 88 enables transistor 86 during the timing out period of circuitry 30. Resistor 94 provides a voltage and current source for the open collector output of pin 2 of comparator 80.

Circuit 98 acts as a power supply to comparator 88 to prevent a false turn on signal when the 12-volt power supply drops out. A transistor 280 inhibits the output if the input voltage drops below 100 VAC. A Zener diode 282 and resistors 284 and 286 create the correct bias voltage for the base of transistor 280 for low input voltage.

Figure 4:
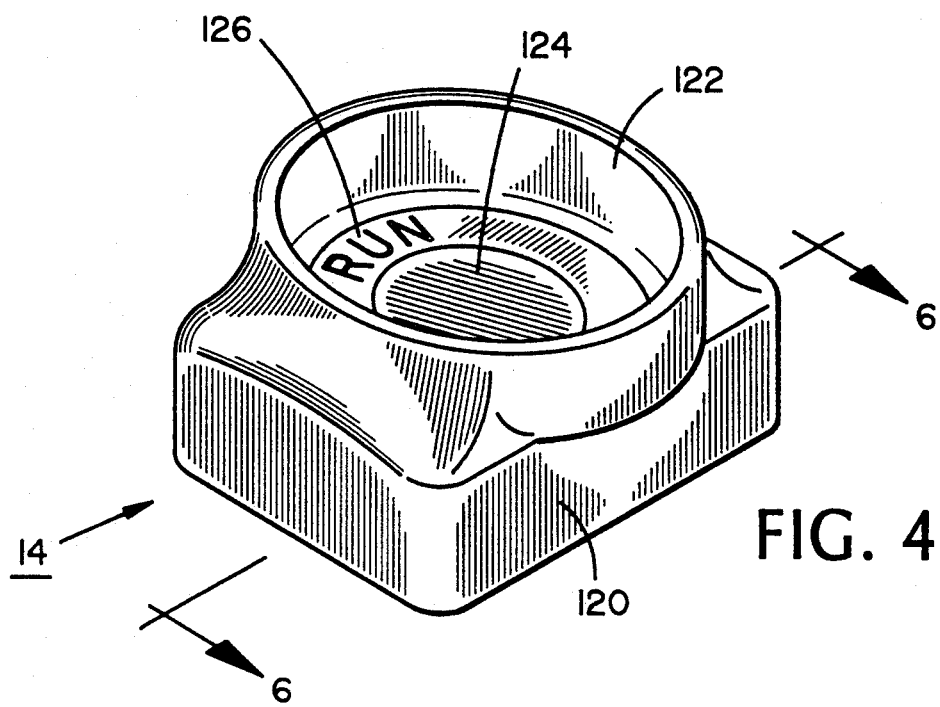
FIG. 4 is a top/front/side perspective view of a switch constructed according to the present invention.
Figure 5:
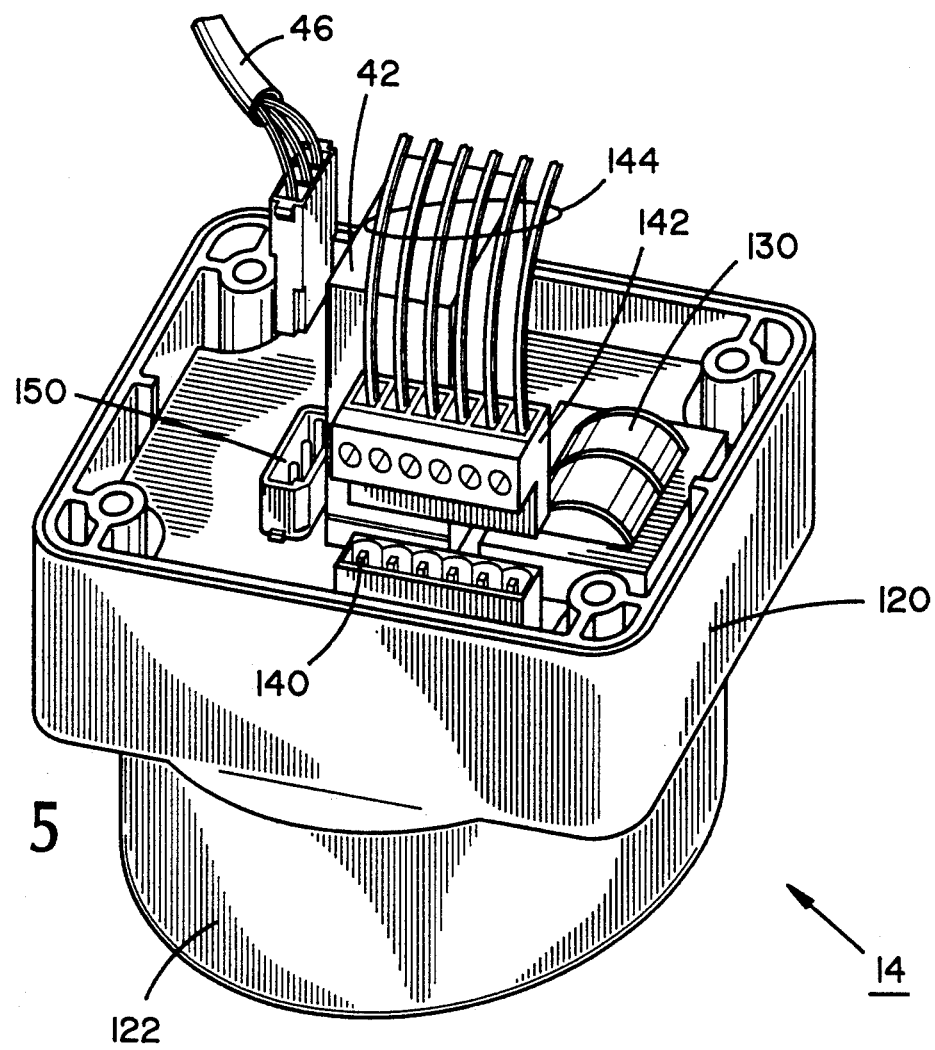
FIG. 5 is a bottom/front/side perspective view of the switch of FIG. 4.
Figure 6:
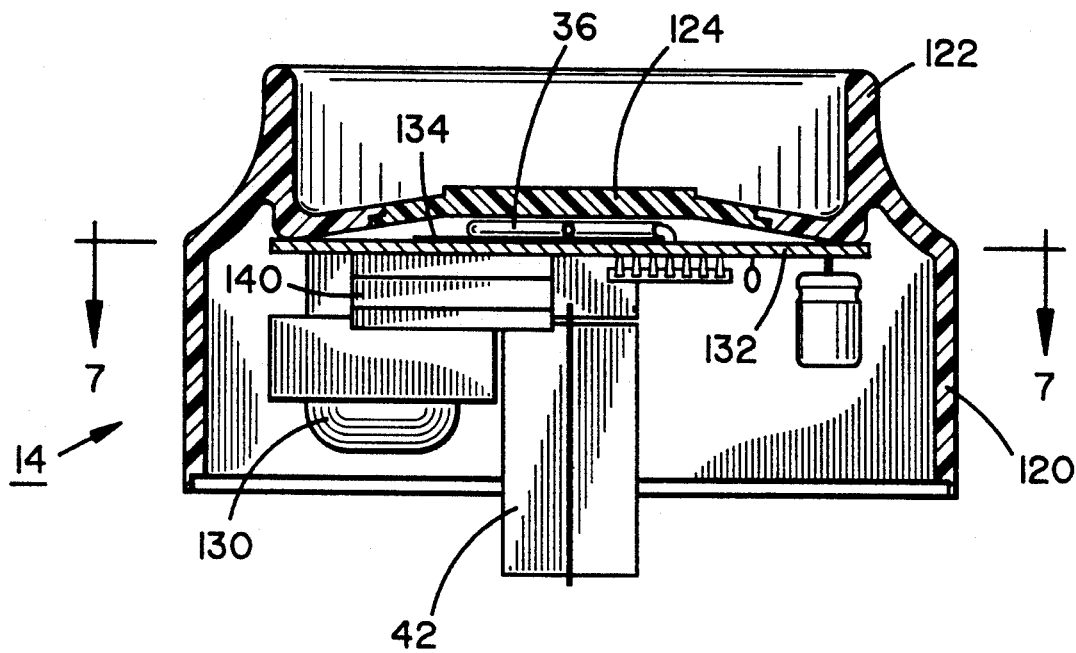
FIG. 6 is a side elevational view, in cross-section, of the switch of FIG. 4 taken along line "6—6" of FIG. 4.

Referring now to FIGS. 4–6, there is illustrated a physical embodiment of switch 14. Switch 14 includes a housing 120 having an upwardly open, ring portion 122, the floor of the latter comprising a touch pad 124 (FIGS. 4 and 6) sealed to the housing. Housing 120 is formed of molded yellow polycarbonate and touch pad 124 is formed of translucent molded green polycarbonate, the latter color being required by the National Electrical Code for "run" buttons. A thinned portion 126 (FIG. 4) of touch pad 124 permits the shinning therethrough of LED 92 (FIG. 3(c)).

Mounted within housing 120 are a transformer 130 (FIGS. 5 and 6), plug-in relay 42 (FIGS. 5 and 6), a printed circuit board 132 (FIG. 6) on which are mounted the components of circuit 30 (FIG. 3(a)-(c)), and sensing coil 36 (FIG. 6). Sensing coil 36 is horizontally disposed below the center of touch pad 124 and is electrically shielded from the components on Printed circuit board 132 by means of a copper shield 134. Also mounted on printed circuit board 132 are a receptacle 140 (FIG. 5) to receive a plug 142 for connection of input and output leads 144 to terminal board 96 (FIG. 3(a)) and a receptacle 150 (FIG. 5) to receive interconnecting cable 46 (FIG. 3(c)) for connection to terminal board 50 also (FIG. 3(c)).

It can be seen that all of the major components of the invention are compactly housed in housing 120 so as to be nearly tamper-proof. Thus, the timed and anti-tie-down safety features, being an integral part of the switches, cannot be defeated easily. Housing 120 may be secured, and preferably locked, to any suitable base, which base may be the base of a conventional switch being replaced by switch 14.

Figure 7:
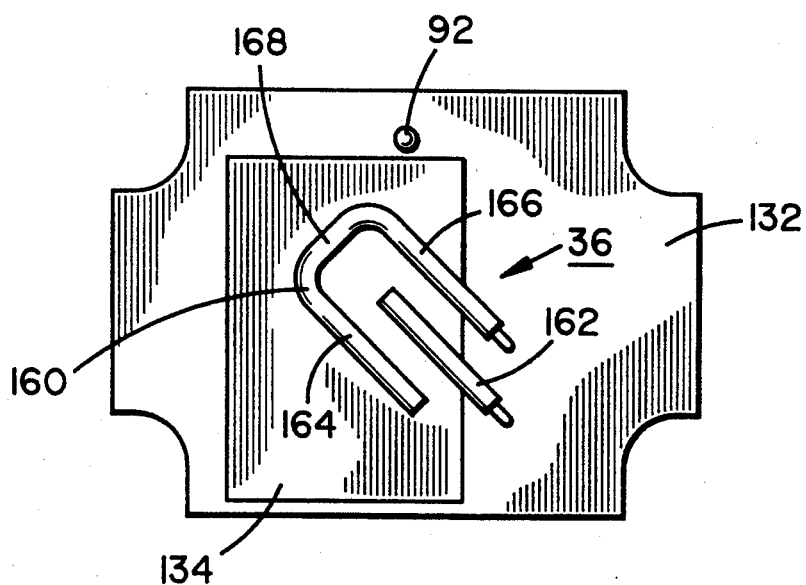
FIG. 7 is a fragmentary top plan view, in cross-section, of the switch of FIG. 4 showing the sensing coil of the present invention taken along line "7—7" of FIG. 6.

Referring now to FIG. 7 will aid in understanding the configuration of sensing coil 36. Sensing coil 36 includes co-planar outer and inner members 160 and 162, respectively. Outer member 160 is generally U-shaped, with two parallel leg portions 164 and 166 joined by a segment 168. Inner member 162 is straight and extends along the central axis of outer member 160 approximately two-thirds of the length of the outer member. Outer and inner members 160 and 162 are formed from insulated 14 AWG solid copper wire. The length of inner member 162 is approximately one inch, while the inside length of leg portions 164 and 166 is approximately one inch, and the inside length of segment 168 is approximately one/half inch. Leg portion 166 and inner member 162 are connected to oscillator circuit 34 (FIG. 3(a)) on printed circuit board 132 (FIG. 6).

As noted above, sensing coil 36 is horizontally disposed beneath the center portion of touch pad 124 (FIG. 6) and is closely spaced to the bottom surface thereof. The center portion of touch pad 124 is of unidimensional thickness and is approximately 0.15 inch thick.

Oscillator circuit 34 energizes sensing coil 36 at 2.5 MHz and circuit 30 is set to that a 50 percent increase in frequency will activate switch 14.

The sensitivity of switch 14 is set such that the switch may be activated by an operator placing his fingers one-eighth of an inch or less from the upper surface of the center of touch pad 124 to allow for the thickness of a glove the operator may be wearing. It has been found that switches constructed according to the present invention cannot be accidentally tripped by liquids that may be present.

It will thus be seen that the objects set forth above, among those elucidated in, or made apparent from, the preceding description, are efficiently attained and, since certain changes may be made in the above construction without departing from the scope of the invention, it is intended that all matter contained in the above description or shown on the accompanying drawing figures shall be interpreted as illustrative only and not in a limiting sense.

It is also to be understood that the following claims are intended to cover all of the generic and specific features of the invention herein described and all statements of the scope of the invention which, as a matter of language, might be said to fall therebetween.

I claim:

1. A switch system having first and second switches for activating punch presses and the like, each said switch comprising:
    (a) a housing;
    (b) electronic circuitry disposed within said housing, said electronic circuitry including timing and anti-tie-down functions; and
    (c) a capacitive sensor coupled to said electronic circuitry, and spaced apart from a portion of said housing which is touched by a user of said system to actuate said switch, each said capacitive sensor comprising:

(i) coplanar outer and inner members;

(ii) said outer member having a single U-shape form with substantially parallel legs connected by a segment; and (iii) said inner member having a straight form lying along the central axis of said outer member and extending into said said outer member approximately two-thirds of the length of said legs.

2. A switch system, as defined in claim 1, further comprising a heavy duty output relay disposed substantially entirely within each said housing and coupled to said electronic circuitry.

3. A switch system, as defined in claim 1, wherein:

(a) said inner member and said legs of said outer member are formed of insulated 14 AWG solid copper wire and said legs are approximately one inch long; and (b) said legs are spaced apart approximately one-half inch.

4. A switch system, as defined in claim 1, wherein said housing includes a generally planar touch pad and said sensor is closely parallely spaced to the lower surface of said touch pad.

5. A switch system, as defined in claim 4, wherein said touch pad is formed of 0.15-inch thick polycarbonate.

6. A switch system, as defined in claim 1, wherein each said switch further comprises:

(a) said housing includes a generally planar touch pad;

(b) a generally planar capacitive sensor disposed in said housing in a plane closely parallely spaced to the lower surface of said touch pad;

(c) a generally planar printed circuit board disposed in said housing on which printed circuit board said electronic circuitry is disposed, said printed circuit board being parallely spaced from said lower surface of said touch pad; and (d) a generally planar copper shield disposed in a plane between and parallel to said planes of said capacitive sensor and said printed circuit board.

7. A switch system, as defined in claim 1, wherein each said housing further includes therein a capacitive sensor and said electronic circuitry includes:

(a) an oscillator circuit coupled to said capacitive sensor such that when an object is in proximity to said sensor, the magnitude of the frequency of said oscillator circuit will change;

(b) a frequency-to-voltage converter coupled to said oscillator to provide an output voltage representative of the level of said frequency; and (c) detector means to detect said output voltage and to permit said switch to close when said output voltage reaches a predetermined level.

8. A switch system, as defined in claim 7, wherein said oscillator circuit energizes said capacitive sensor at about 2.5 MHz.

9. A switch system, as defined in claim 8, wherein said detector means will permit said switch to close when said output voltage reaches a level indicating approximately a 50 percent increase in said frequency.

10. A switch system having first and second switches for activating punch presses and the like, said first and second switches each comprising:

(a) a housing;

(b) capacitive sensing means disposed in said housing to detect the proximity of a portion of an operator of said switch system and to provide an output voltage proximity signal at a level indicating said proximity; and (c) timed and anti-tie-down circuit means; and wherein, in operation:

(d) said timed and anti-tie-down circuit means in one of said first and second switches receives said proximity signal, provides a timed signal to the other of said first and second switches indicating the presence of said proximity signal for a selected interval of time, receives a timed signal from said other of said first and second switches if timed and anti-tie-down circuit means in said other of said first and second switches has received a proximity signal from capacitive sensing means in said other of said first and second switches for said selected interval of time, and closes said one of said first and second switches only if said proximity signal in said other of said first and second switches has been received for a selected period of time less than said selected interval of time.

11. A switch system, as defined in claim 10, wherein, if said proximity signal in said other of said first and second switches has been received for said selected interval of time, said timed and anti-tie-down circuit means in said one of said first and second switches will prevent said one of said first and second switches from closing until said proximity signal in said other of said first and second switches is absent.

12. A switch system, as defined in claim 10, wherein said capacitive sensing means includes a capacitive sensor comprising:

(a) coplanar outer and inner members spaced apart from a portion of said housing which is touched by a user of said system to actuate said switch;

(b) said outer member having a single U-shape form with substantially parallel legs connected by a segment; and (c) said inner member having a straight form lying along the central axis of said outer member and extending into said said outer member approximately two-thirds of the length of said legs.

13. A switch system, as defined in claim 12, wherein:

(a) said inner member and said legs of said outer member are formed of insulated 14 AWG solid copper wire and said legs are approximately one inch long; and (b) said legs are spaced apart approximately one-half inch.

14. A switch system, as defined in claim 12, wherein said housing includes a generally planar touch pad and said sensor is closely parallely spaced to the lower surface of said touch pad.

15. A switch system, as defined in claim 14, wherein said touch pad is formed of 0.15-inch thick polycarbonate.

16. A switch system, as defined in claim 10, wherein said said switch further comprises:

(a) said housing includes a generally planar touch pad;

(b) a generally planar capacitive sensor disposed in a plane closely parallely spaced to the lower surface of said touch pad;

(c) a generally planar printed circuit board on which said electronic circuitry is disposed, said printed circuit board being parallely spaced from said lower surface of said touch pad; and (d) a generally planar copper shield disposed in a plane between and parallel to said planes of said capacitive sensor and said printed circuit board.

17. A switch system, as defined in claim 16, wherein each said each said capacitive sensing means comprises:
    (a) a capacitive sensor;
    (b) an oscillator circuit coupled to said capacitive sensor such that when an object is in proximity to said sensor, the magnitude of the frequency of said oscillator circuit will change;
    (c) a frequency-to-voltage converter coupled to said oscillator to provide an output voltage representative of the level of said frequency; and
    (d) detector means to detect said output voltage and to permit said switch to close when said output voltage reaches a predetermined level.

18. A switch system, as defined in claim 17, wherein said capacitive sensor is spaced apart from a portion of said housing which is touched by a user of said system to actuate said switch, and said capacitive sensor comprises:
    (a) coplanar outer and inner members;
    (b) said outer member having a single U-shape form with substantially parallel legs connected by a segment; and
    (c) said inner member having a straight form lying along the central axis of said outer member and extending into said said outer member approximately two-thirds of the length of said legs.

19. A switch system, as defined in claim 18, wherein said oscillator circuit energizes said capacitive sensor at about 2.5 MHz.

20. A switch system, as defined in claim 19, wherein said detector means will cause said each said switch to close when said output voltage reaches a level indicating approximately a 50 percent increase in said frequency.

* * * * *